July 30, 1957 T. H. QUINN 2,801,302

COMPOUND ACTION GAIN CONTROL

Filed June 2, 1955

INVENTOR.

Truman H. Quinn

BY

Roland A. Anderson

Attorney

United States Patent Office
2,801,302
Patented July 30, 1957

2,801,302

COMPOUND ACTION GAIN CONTROL

Truman H. Quinn, Richland, Wash., assignor to the United States of America as represented by the United States Atomic Energy Commission Application June 2, 1955, Serial No. 512,902

3 Claims. (Cl. 179—171)

The present invention relates generally to circuits for controlling the amount of gain between stages of electronic circuits and in particular to a gain control circuit for controlling the amount of gain between the stages of pulse amplifiers.

At the present time, various electronic applications require the use of gain control in circuits which are used for measuring changing voltages and currents. One of the well known circuits used in measuring electrical changes is the pulse amplifier. Various gain control circuits have been used with the pulse amplifier to vary the gain between the stages comprising said amplifier. However, the interstage gain control circuits in common use are not satisfactory because they have a tendency to change their impedance whenever a gain selector is varied to control the amount of gain and also because they change the bias of the tubes in the stages preceding and succeeding the interstage position of the gain control circuit whenever the gain level is changed.

It is an object of the present invention to provide a circuit with a signal impressed thereacross to have a variable output.

It is another object of this invention to provide a circuit to use in conjunction with other circuit stages to control the amount of gain therebetween.

It is a further object of the invention to provide a gain control circuit which will possess substantially the same input and output impedances irrespective of variations in gain.

It is another object of the invention to provide a gain control circuit which is reliable and will exert no deleterious operational effects on the various circuits with which it is employed.

It is a further object of the invention to provide a gain control circuit for interstage use in pulse amplifiers for controlling the amount of gain between stages.

Figure 2:
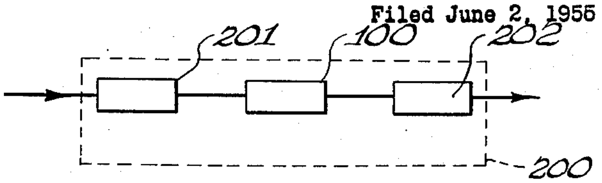
Figure 1:
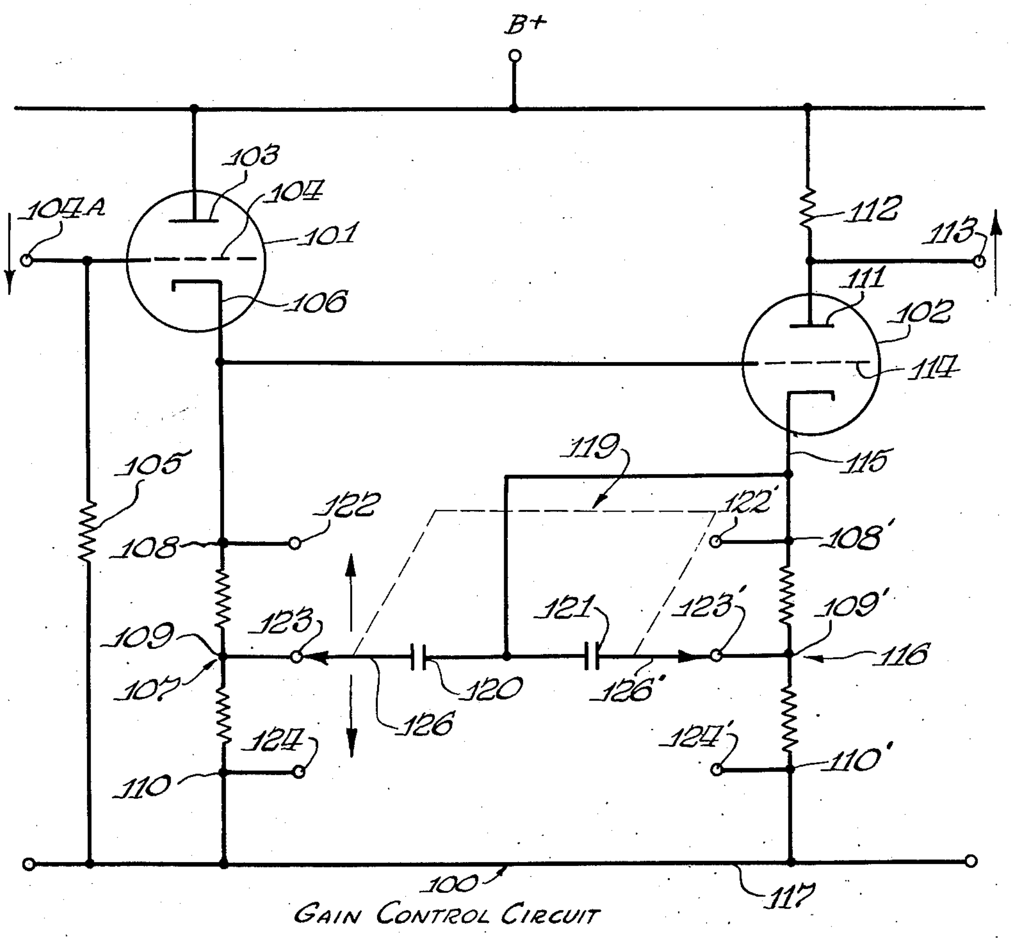

Further objects and advantages of this invention will become apparent and will be better understood by reference to the following description in conjunction with the accompanying drawing, wherein:

Fig. 1 discloses a circuit diagram of a gain control circuit constructed in accordance with the teachings of the invention; and Fig. 2 is a block diagram depicting the use of the gain control circuit between the stages of a pulse amplifier.

In accordance with the teachings of this invention, a gain control circuit is provided for use with other circuits having several stages such as a pulse amplifier. The gain control circuit utilizes a pair of tubes which are coupled together by appropriate means to obtain variation in gain. One of the tubes is used as a cathode follower wherein an input signal is impressed on the grid thereof and the output is taken off from the cathode and impressed on the grid of the other tube. The cathode load of the second tube is adjustably coupled to the cathode load of the first tube and variably by-passed by a capacitor to provide different degrees of degeneration.

Referring to Fig. 1, a gain control circuit 100 comprises a pair of triode tubes 101 and 102. The tube 101 has a plate 103 connected to a source of B+ potential, a grid 104 connected to a terminal 104A, upon which an input signal may be impressed, and also connected through a resistor 105 to lead 117, and a cathode 106 connected to lead 117 through a tapped resistor 107 having a plurality of terminals 108—110, wherein the terminal 109 corresponds to the midpoint of the resistance 107. The other triode 102 has a plate 111 connected through a resistor 112 to the source of B+ potential, the plate 111 providing an output at a terminal 113, a grid 114 connected to the cathode 106 of the tube 101, and a cathode 115 connected to lead 117 through a tapped resistor 116 having multiple terminals 108'—110'. The cathode circuits of both triodes are coupled together by means of a switch 119 and a pair of capacitors 120 and 121. The switch 119 has a series of contacts 122—124 and a movable contact 126 for establishing a connection therewith; another series of contacts 122'—124' and a movable contact 126' for establishing connection therewith. The sliding contact 126 is connected through a series connection comprising the capacitors 120 and 121 to the sliding contact 126'. The junction between the two capacitors 120 and 121 is connected to the cathode 115 of the tube 102. The contacts 122—124 of the switch 119 are connected to the terminals 108—110, respectively, and the contacts 122'—124' are connected to the terminals 108'—110', respectively, of the resistor 116. As is evident from the circuit diagram, the first triode functions in a cathode follower circuit, the output of which is fed from the cathode 106 and impressed on the grid 114 of the tube 102. The variation of voltage existing at the plate 111 of the amplifier tube 102 is made available at the terminal 113 for connection to other stages.

Fig. 2 discloses the use of the gain control circuit in conjunction with a pulse amplifier 200. The pulse amplifier 200 may be any one of the types well known in the electronics art and it is, therefore, unnecessary to enter into detailed discussion on its construction and operation. The pulse amplifier 200 may be considered as having at least two stages 201 and 202, the gain control circuit 100 being placed therebetween to effect variation of gain. It is to be understood that the use of the gain control 100 in a pulse amplifier 200 is for illustrative purposes only, said gain control 100 having wider applications in other electrical circuits.

As was stated before, the gain control circuit 100 utilizes variation in input together with degeneration to control the gain. When the switch 119 is in a position wherein the movable contacts 126 and 126' are in contact with the contacts 122 and 122', respectively, this position corresponds to zero gain position for an input comprising variable signal voltages such as pulses. During this time, the capacitor 120 couples the cathode 106 of the cathode follower tube 101 to the cathode 115 of the triode tube 102 to effectively impress no signal across the grid 114 and the cathode 115 of the tube 102.

If the gain control circuit 100 is set to a mid position, i. e., the switch 119 has its sliding contacts 126 and 126' set against the contacts 123 and 123', respectively, a larger portion of the voltage developed across the tapped resistor 107 is impressed through the capacitor 120 on the cathode 115 and the cathode resistor 116 is partially by-passed by the capacitor 121, to decrease the self-cathode degeneration in the circuit of the tube 102, therefore, causing an increase in gain. Thus it is evident that a change in gain is obtained by simultaneously varying the input signal and by-passing the cathode resistor in the second tube.

Finally, when the coupling between the tubes 101 and 102 in the gain control circuit 100 is adjusted wherein the switch 119 has its sliding contacts 126 and 126' in contact with the contacts 124 and 124', respectively, this position corresponding to maximum gain, both of the capacitors 120 and 121 are placed in shunt and by-pass the cathode 115 of the tube 102 to lead 117 removing all "self-degeneration" in the cathode circuit of the tube 102. In this position, the gain is at a maximum because the maximum voltage developed across the cathode resistor 107 is impressed through the capacitor 120 across the grid 114 and the cathode 115 and because by-passing the cathode 115 eliminates degeneration. Continuously variable gain resistors, either linear or nonlinear, may be used to replace the resistors 107 and 116 to provide flexibility in control.

While there has been described what is at present considered to be the preferred embodiment of the invention, it will be understood that various modifications may be made herein and it is intended in the appended claims to cover all such modifications as found within the true spirit and scope of the invention.

What is claimed is:

1. A circuit for controlling gain between stages of a pulse amplifier, comprising, a source of potential, a cathode follower circuit including a tube having a plate, grid and a cathode, the plate being connected to the source of potential, and the cathode being connected through a multi-tapped resistor to a common lead to provide an input, an amplifier circuit including a tube having a plate, grid, and a cathode, the plate being connected through a resistor to the source of potential, the cathode being connected through another multi-tapped resistor to the common lead, and the grid being connected to the cathode in the cathode follower circuit, and variable means including capacitors for selectively connecting the amplifier cathode to a desired tap on each of said resistors to simultaneously vary the coupling between the two circuits and variably by-pass the second tapped resistor to control the amount of input and degeneration developed across the amplifier circuit, whereby the amount of gain in said amplifier circuit is dependent upon the input voltage impressed between the grid cathode in the amplifier circuit and the amount of degeneration developed across the second tapped resistor.

2. A circuit for controlling gain between stages of electronic equipment, comprising, a cathode follower tube having a plate, a grid and a cathode, a source of voltage, the plate and the cathode including a resistor being connected across the source of voltage, the grid being connected through a grid resistor to the cathode resistor and adapted to receive an input signal, a second tube having a plate, a grid and a cathode, the plate of the second tube being connected through a resistor to one side of the voltage source and adapted to provide an output, the cathode of the second tube being connected through a resistor to the other side of the voltage source, and the grid of said second tube being connected to the cathode of the first tube, and means including capacitors for variably coupling both of said cathode resistors to vary the amount of input impressed on the cathode of the second tube and to by-pass the cathode resistor of the second tube, the gain of the output being dependent upon the input signal to the cathode of the second tube and the amount of degeneration occurring in the cathode resistor of the second tube, whereby, due to the utilization of a cathode follower tube, the impedance of the circuit remains essentially the same regardless of the amount of gain obtained therethrough.

3. In a circuit for controlling gain between stages of electronic equipment, comprising a cathode follower circuit including a tube having a grid, a plate and a cathode, a source of voltage, the plate being connected to the voltage source, the cathode being connected through a multi-tapped resistor to a common lead, the grid being connected through a resistor to the common lead, an amplifier circuit including a tube having a grid, a plate and a cathode, the plate being connected through a resistor to the voltage source, the cathode being connected through a second multi-tapped resistor to the common lead, and the grid being connected to the cathode in the cathode follower circuit to provide an input to the amplifier, the cathode in the amplifier circuit being connected through a capacitor to a switch accessible to all contacts on the cathode follower tapped resistor to provide a second input to the amplifier, the cathode in the amplifier circuit also being connected through another capacitor to a second switch accessible to all contacts on the amplifier tapped resistor, the first and second switches being ganged together to provide for simultaneously varying the input to the amplifier and the amplifier degeneration to control the gain of the circuit.

References Cited in the file of this patent

UNITED STATES PATENTS

| | | |
|---|---|---|
| 2,022,972 | Nebel | Dec. 3, 1935 |
| 2,351,934 | Kramolin | June 20, 1944 |
| 2,464,594 | Mahoney | Mar. 15, 1949 |

FOREIGN PATENTS

| | | |
|---|---|---|
| 833,510 | Germany | Mar. 10, 1952 |